(12) United States Patent
Kataoka

(10) Patent No.: US 11,444,154 B2
(45) Date of Patent: Sep. 13, 2022

(54) SEMICONDUCTOR DEVICE WITH A PROTECTED ELEMENT

(71) Applicant: KABUSHIKI KAISHA TOKAI-RIKA-DENKI-SEISAKUSHO, Aichi-ken (JP)

(72) Inventor: Yoshikazu Kataoka, Aichi-ken (JP)

(73) Assignee: KABUSHIKI KAISHA TOKAI-RIKA-DENKI-SEISAKUSHO, Aichi-ken (JP)

(*) Notice: Subject to any disclaimer, the term of this patent is extended or adjusted under 35 U.S.C. 154(b) by 0 days.

(21) Appl. No.: 17/260,598

(22) PCT Filed: Jul. 8, 2019

(86) PCT No.: PCT/JP2019/027013
§ 371 (c)(1),
(2) Date: Jan. 15, 2021

(87) PCT Pub. No.: WO2020/017381
PCT Pub. Date: Jan. 23, 2020

(65) Prior Publication Data
US 2021/0328006 A1 Oct. 21, 2021

(30) Foreign Application Priority Data
Jul. 18, 2018 (JP) .............................. JP2018-135260

(51) Int. Cl.
*H01L 29/06* (2006.01)
*H01L 23/00* (2006.01)
*H01L 29/861* (2006.01)

(52) U.S. Cl.
CPC .......... *H01L 29/0611* (2013.01); *H01L 24/05* (2013.01); *H01L 24/48* (2013.01);
(Continued)

(58) Field of Classification Search
CPC ..... H01L 29/0611; H01L 24/05; H01L 24/48; H01L 29/861; H01L 2224/04042;
(Continued)

(56) References Cited

U.S. PATENT DOCUMENTS 7,583,486 B2 9/2009 Ozoe
2007/0080404 A1* 4/2007 Fukuro ............... H01L 27/0251
257/360

(Continued)

FOREIGN PATENT DOCUMENTS

JP 2006237651 A 9/2006
JP 4354876 B2 10/2009

OTHER PUBLICATIONS

PCT International Search Report for corresponding PCT Application No. PCT/JP2019/027013, dated Aug. 27, 2019, 1 page.

*Primary Examiner* — Mamadou L Diallo
(74) *Attorney, Agent, or Firm* — Dority & Manning, P.A.

(57) ABSTRACT

A semiconductor device includes a protected element and a connection section. The protected element is configured including a diode having an anode region and a cathode region. The diode is arranged on an active layer of a substrate including the active layer formed over a conductive substrate-support with an insulation layer interposed therebetween. The connection section electrically connects the cathode region of the protected element to the substrate-support.

7 Claims, 3 Drawing Sheets

(52) U.S. Cl.
 CPC .. *H01L 29/861* (2013.01); *H01L 2224/04042* (2013.01); *H01L 2224/48245* (2013.01)
(58) Field of Classification Search
 CPC ....... H01L 2224/48245; H01L 23/4952; H01L 23/49562; H01L 24/49; H01L 24/29; H01L 24/32; H01L 24/45; H01L 24/73; H01L 29/8611
 See application file for complete search history.

(56) References Cited

U.S. PATENT DOCUMENTS

| | | | |
|---|---|---|---|
| 2012/0086079 A1* | 4/2012 | Kasai | H01L 27/14607 |
| | | | 257/347 |
| 2017/0207174 A1* | 7/2017 | Hoshi | H01L 21/0485 |
| 2017/0222432 A1* | 8/2017 | Iwasawa | H01L 23/5223 |
| 2018/0076254 A1* | 3/2018 | Kasai | H01L 27/14689 |
| 2021/0074839 A1* | 3/2021 | Haynie | H01L 21/765 |

* cited by examiner

SEMICONDUCTOR DEVICE WITH A PROTECTED ELEMENT

CROSS-REFERENCE TO RELATED APPLICATIONS

This application is a national phase application of International Application No. PCT/JP2019/027013 filed on Jul. 8, 2019, which, in turn, is based upon and claims the right of priority to JP Patent Application No. 2018-135260 filed on Jul. 18, 2018, the disclosures of both of which are hereby incorporated by reference herein in their entirety for all purposes.

TECHNICAL FIELD

The present invention relates to a semiconductor device, and in particular to effective technology applicable to a semiconductor device including a protected element.

BACKGROUND ART

Japanese Patent No. 4354876 discloses a semiconductor device adopting a silicon on insulator (SOI) substrate. The SOI substrate is formed as a layered structure including a silicon substrate, a buried oxide film on the silicon substrate, and a p-type active layer on the buried oxide film. A metal-oxide-semiconductor field-effect transistor (MOSFET) is formed on the p-type active layer.

Generally a silicon substrate of a SOI substrate is either in a floating state not applied with an electrical potential, or a ground potential is applied to the silicon substrate.

However, in cases in which a p-n junction diode having a high withstand voltage structure is formed on the p-type active layer of the SOI substrate as a protected element, there is a need to set a low impurity concentration for the p-type active layer so as to raise the withstand voltage of the junction at the p-n junction. However, when a change is made to the impurity concentration of the p-type active layer, this alters the element characteristics of other elements other than the p-n junction diode, and specifically changes the threshold voltage ($V_{th}$) and the like of a MOSFET.

SUMMARY OF INVENTION

Technical Problem

In consideration of the above circumstances, the present invention provides a semiconductor device capable of increasing a withstand voltage of a protected element without affecting characteristics of other elements.

Solution to Problem

A semiconductor device according to a first aspect of the present invention includes a protected element and a connection section. The protected element is configured including a p-n junction diode between an anode region and a cathode region. The p-n junction diode is arranged on an active layer of a substrate including the active layer formed over a conductive substrate-support with an insulation layer interposed between the active layer and the substrate-support. The connection section electrically connects the cathode region to the substrate-support.

The semiconductor device according to the first aspect includes the protected element on the substrate. The substrate includes the conductive substrate-support, an insulation layer on the substrate-support, and the active layer on the insulation layer. The protected element is configured including the p-n junction diode arranged in the active layer between the anode region and the cathode region.

The semiconductor device further includes the connection section. The connection section electrically connects the cathode region to the substrate-support. Supposing a positive surge voltage were to be applied to the cathode region, then this surge voltage would also be applied to the substrate-support. The substrate is constructed with a field plate structure including the substrate-support, the insulation layer, and the active layer. When a surge voltage is applied to the substrate-support, a depletion layer formed at the p-n junction between the anode region and the cathode region spreads due to the field plate effect, alleviating the electric field occurring at the p-n junction. This accordingly enables a junction withstand voltage of the p-n junction diode to be increased without setting a lower impurity concentration in the active layer.

A semiconductor device according to a second aspect of the present invention is the semiconductor device according to the first aspect, wherein the connection section is electrically connected to both at least a portion of a region of the substrate-support opposing the p-n junction diode and to the cathode region, or is electrically connected to both a portion of the substrate-support in close proximity to the p-n junction diode and to the cathode region.

The semiconductor device according to the second aspect is configured with the connection section electrically connected to both at least the portion of the region of the substrate-support opposing the p-n junction diode and to the cathode region. Alternatively, the connection section is electrically connected to both the portion of the substrate-support in close proximity to the p-n junction diode and to the cathode region.

Thus, supposing a surge voltage were to be applied to the cathode region, then the surge voltage would also immediately be applied to the region of the substrate-support opposing the p-n junction diode, or in close proximity thereto. The electric field occurring at the p-n junction would accordingly be immediately alleviated, enabling the junction withstand voltage of the p-n junction diode to be increased.

A semiconductor device according to a third aspect of the present invention is the semiconductor device according to the first aspect or the second aspect, further including a semiconductor element arranged in the active layer in a separate region to the protected element. The semiconductor element is any one out of an insulated-gate field-effect transistor, a bipolar transistor, a diffusion resistor, or a metal-insulator-semiconductor capacitor.

In the semiconductor device according to the third aspect, the semiconductor element is arranged in the active layer in a separate region to the protected element. The semiconductor element is at least one out of an insulated-gate field-effect transistor, a bipolar transistor, a diffusion resistor, or a metal-insulator-semiconductor capacitor. This enables the junction withstand voltage of the p-n junction diode to be increased without setting a lower impurity concentration in the active layer, and so the characteristics of the semiconductor element are not altered.

A semiconductor device according to a fourth aspect of the present invention is the semiconductor device according to any one out of the first aspect to the third aspect, further including an external terminal arranged on the substrate and electrically connected to the cathode region, a die pad or wiring board mounted with the substrate and electrically connected to the substrate-support, and a lead electrically connected to the external terminal through a wire. The connection section is configured including a path electrically connecting the lead either to the die pad or to the wiring board.

The semiconductor device according to the fourth aspect further includes the external terminal, the die pad or wiring board, and the lead. The external terminal is arranged on the substrate and is electrically connected to the cathode region. The die pad or wiring board has the substrate mounted thereto, and is electrically connected to the substrate-support of the substrate. The lead is electrically connected to the external terminal through the wire. The connection section is configured including the path electrically connecting the lead either to the die pad or to the wiring board.

Thus, supposing a surge voltage were to be applied from the lead to the cathode region via the wire and the external terminal, the surge voltage could be applied from the lead to the substrate-support via the die pad or wiring board. This enables an increase in the junction withstand voltage of the p-n junction diode to be easily implemented due to the field plate effect.

A semiconductor device according to a fifth aspect of the present invention is the semiconductor device according to any one out of the first aspect to the third aspect, wherein the connection section includes a trench extending from a surface of the active layer as far as the substrate-support, an insulation body arranged on side walls of the trench, and a conductor filling the trench with the insulation body interposed between the conductor and the trench. The cathode region and the substrate-support are electrically connected through the conductor.

In the semiconductor device according to the fifth aspect, the connection section includes the trench, the insulation body, and the conductor. The trench is configured extending from the surface of the active layer as far as the substrate-support. The insulation body is arranged on the side walls of the trench. The conductor fills the trench with the insulation body interposed between the conductor and the trench. The cathode region is electrically connected to the substrate-support through the conductor.

Thus, supposing a surge voltage were to be applied to the cathode region, then the surge voltage could easily be applied to the substrate-support through the conductor that fills the trench. This accordingly enables an increase in the junction withstand voltage of the p-n junction diode to be easily implemented due the field plate effect.

Advantageous Effects of Invention

The present invention enables the provision of a semiconductor device capable of increasing the withstand voltage of a protected element without effecting the characteristics of another element.

DESCRIPTION OF EMBODIMENTS

First Exemplary Embodiment

Figure 1:
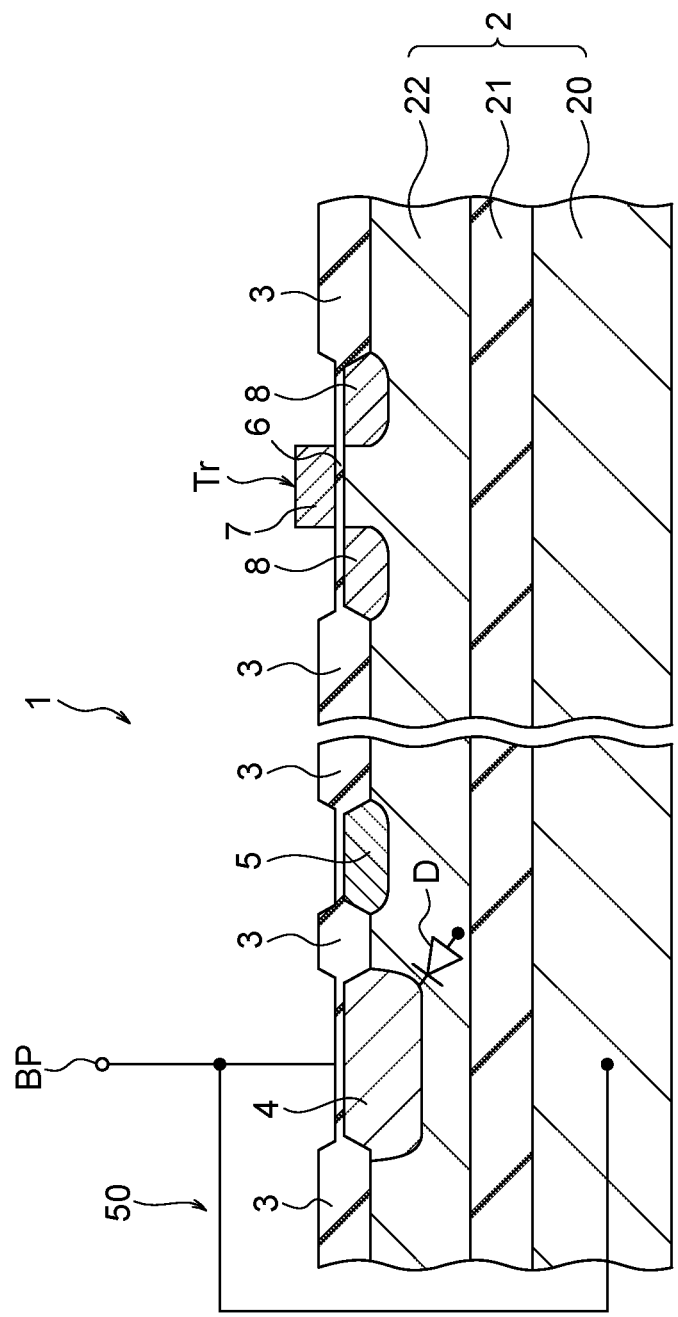
FIG. 1 is a vertical cross-section structural diagram schematically illustrating an enlargement of relevant portions of a semiconductor device according to a first exemplary embodiment of the present invention.
Figure 2:
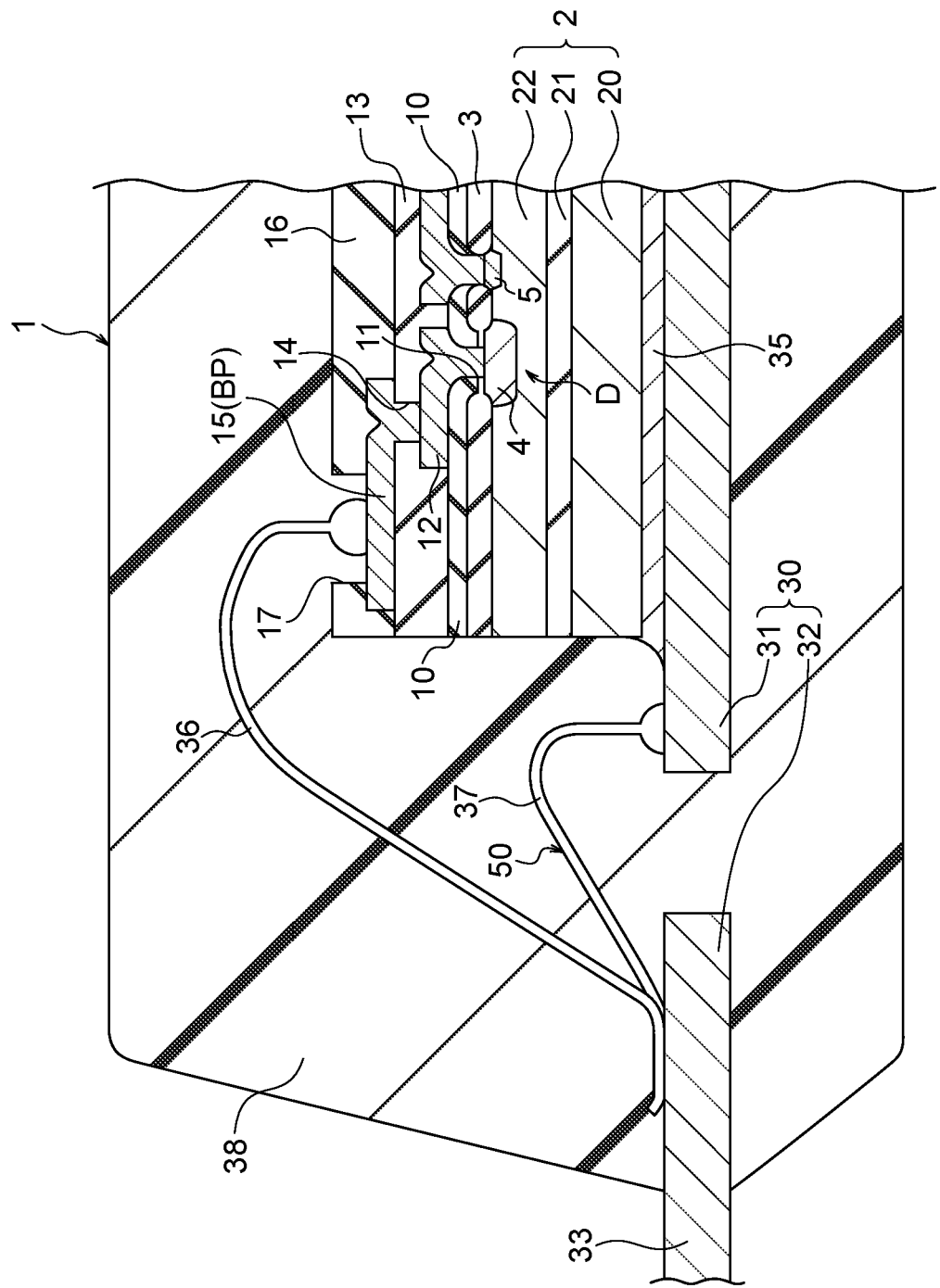
FIG. 2 is a cross-section illustrating a packaging structure of a semiconductor device according to the first exemplary embodiment.

Explanation follows regarding a semiconductor device according to a first exemplary embodiment of the present invention, with reference to FIG. 1 and FIG. 2.

Semiconductor Device 1 Substrate Cross-Section Structure

As illustrated in FIG. 1, a semiconductor device 1 according to the present exemplary embodiment is principally configured by a substrate (a semiconductor pellet or a semiconductor chip) 2. A p-n junction diode D (hereafter simply referred to as the diode D), serving as a protected element, is arranged on a portion on a main face of the substrate 2. The diode D is electrically connected to an external terminal BP by connecting in the reverse direction.

A SOI substrate is employed as the substrate 2. Namely, the substrate 2 has a structure of sequentially stacked layers of a conductive substrate-support 20, an insulation layer 21 formed on the substrate-support 20, and an active layer 22 formed on the insulation layer 21.

In this example, the substrate-support 20 is formed by a monocrystalline silicon substrate set as p-type with a low impurity concentration. Note that the substrate-support 20 may be set as p-type with a medium or high impurity concentration, or alternatively may be set as n-type.

The insulation layer 21 is formed by a buried oxide (BOX) film, and more specifically is formed by a silicon oxide film. The insulation layer 21 is for example formed using an ion implantation method in which oxygen is implanted into the substrate-support 20 so as to cause localized oxidation of silicon in the substrate-support 20.

In this example, the active layer 22 is, similarly to the substrate-support 20, formed by a monocrystalline silicon substrate set as p-type with a low impurity concentration. The active layer 22 is formed using part of a surface layer of the substrate-support 20, and forming the insulation layer 21 creates a partition (electrically isolates) between the active layer 22 and the substrate-support 20 about the insulation layer 21 as a boundary. The diode D is arranged in the active layer 22, and another circuit-configuring semiconductor element other than the diode D is also arranged in the active layer 22.

Although there is no particular limitation thereto, in this example, an insulated-gate field-effect transistor Tr (IGFET; hereafter simply referred to as the transistor Tr) is arranged as the semiconductor element. Note that use of the term IGFET encompasses both MOSFET and metal-insulator-semiconductor field-effect transistors (MISFET).

There are element isolation regions 3 respectively arranged in the active layer 22 main face between the diode D and the transistor Tr. In this example, the element isolation regions 3 are configured by a silicon oxide film formed by selectively oxidizing the surface of the active layer 22. The element isolation regions 3 electrically isolate between elements, such as between the diode D and the transistor Tr.

The diode D is configured with a p-n junction between the p-type active layer 22 serving as an anode region and an n-type semiconductor region 4 serving as a cathode region. The n-type semiconductor region 4 is formed by introducing n-type impurities into the active layer 22 from the surface thereof using an ion implantation method or a solid phase diffusion method, and activating the n-type impurities. The impurity concentration of the n-type semiconductor region 4 is set higher than the impurity concentration of the active layer 22.

A p-type semiconductor region 5 of the same conductivity type as the active layer 22 is arranged on a portion of the main face of the active layer 22 serving as the anode region. The p-type semiconductor region 5 is set with a higher impurity concentration than the impurity concentration of the n-type semiconductor region 4. Thus arranging the p-type semiconductor region 5 enables a reduction in contact resistance between the active layer 22, serving as the anode region, and wiring that is electrically connected thereto (wiring 12 illustrated in FIG. 2) to be achieved.

The transistor Tr is arranged on the main face of the active layer 22 within a region surrounded by the element isolation region 3. The transistor Tr is configured including the active layer 22 employed as a channel forming region, n-type semiconductor regions 8 that form a pair of main electrodes that respectively serve as a source region and a drain region, a gate insulation film 6, and a gate electrode 7.

The pair of n-type semiconductor regions 8 are arranged on the main face of the active layer 22 with a spacing in a gate width direction therebetween. Although the n-type semiconductor regions 8 have the opposite conductivity type to the p-type semiconductor region 5, the n-type semiconductor regions 8 are set with a similar level of impurity concentration to the p-type semiconductor region 5. A region of the active layer 22 between the pair of n-type semiconductor regions 8 is employed as a channel forming region.

The gate insulation film 6 is at least formed between the pair of n-type semiconductor regions 8 on the main face of the active layer 22. A monolayer film configured of a silicon oxide film, or a stacked composite film including a silicon oxide film and a silicon nitride film, may be employed as the gate insulation film 6.

The gate electrode 7 is arranged on the gate insulation film 6. For example, a monolayer film configured from a polycrystalline silicon film doped with impurities so as to be adjusted to a low resistance value, or a stacked composite film including a high-melting-point metal film or a high-melting-point metal-silicide film on a polycrystalline silicon film, may be employed as the gate electrode 7.

The transistor Tr configured in this manner is thereby set to n-channel conductivity type. Note that in the present exemplary embodiment a non-illustrated p-channel conductivity type transistor is also arranged in the active layer 22 so as to construct a pair of complementary transistors.

Semiconductor Device 1 Packaging Structure

Although not illustrated in FIG. 1, a first layer passivation film 10, a first layer wiring 12, a second layer passivation film 13, a second layer wiring 15, and a third layer passivation film 16 are respectively arranged in this sequence on the substrate 2, as illustrated in FIG. 2. Although a dual layer wiring structure including the wiring 12 and the wiring 15 is adopted in the semiconductor device 1 in the present exemplary embodiment, a monolayer wiring structure or a wiring structure of three or more layers may be adopted.

The first layer passivation film 10 is formed over the element isolation regions 3, including over the diode D and over the transistor Tr illustrated in FIG. 1. A monolayer film configured by a silicon oxide film or a silicon nitride film, or a composite film configured thereof, is employed as the passivation film 10. The passivation film 10 is formed with a main purpose of keeping the first layer wiring 12 electrically isolated from the diode D, the transistor Tr, and on.

The first layer wiring 12 having a prescribed wiring pattern is arranged on the passivation film 10. One end portion of one line of the wiring 12 is connected to the n-type semiconductor region 4 serving as the cathode region of the diode D through a connection hole 11 formed penetrating the passivation film 10 in its film thickness direction. The other end portion of this wiring 12 extends over the passivation film 10.

One end portion of another line of the wiring 12 is connected to the p-type semiconductor region 5 serving as the anode region of the diode D through a connection hole 11. The other end portion of the other line of the wiring 12 is connected to a circuit, not illustrated in the drawings.

For example, an aluminum alloy film to which copper (Cu) and silicon (Si) has been added is employed as the wiring 12.

The second layer passivation film 13 is formed over the passivation film 10, including over the wiring 12. The passivation film 13 is, for example, formed of a similar material to the passivation film 10.

The second layer wiring 15 having a prescribed wiring pattern is arranged over the passivation film 13. One end portion of one line of the wiring 15 is connected to the other end portion of the wiring 12 connected to the n-type semiconductor region 4 through a connection hole 14 formed penetrating the passivation film 13 in its film thickness direction. The other end portion of the wiring 15 configures the external terminal BP. An upper face of the external terminal BP is exposed inside a bonding opening 17 formed penetrating in the film thickness direction through the third layer passivation film (final passivation film) 16 arranged over the passivation film 13 including over the wiring 15.

The passivation film 13 and the passivation film 16 are for example formed of a similar material to the passivation film 10. Similarly, the wiring 15 may be formed of a similar material to the wiring 12.

As illustrated in FIG. 2, the semiconductor device 1 further includes a lead 30, the substrate 2, a bonding wire 36, and an encapsulation resin 38. More specifically, the lead 30 is configured including a die pad (tab) 31, an inner lead 32, and an outer lead 33.

The substrate 2 is bonded onto the die pad 31 through a bonding material 35. A back face of the substrate-support 20 of the substrate 2 is disposed so as to oppose an upper face of the die pad 31. For example, a silver (Ag) paste is employed as the bonding material 35. Namely, the die pad 31 is electrically connected to the substrate-support 20.

The inner lead 32 is laid so as to surround the die pad 31 in the in-plane direction of the die pad 31. The inner lead 32 is arranged inside the encapsulation resin 38. One end portion on the die pad 31-side of the inner lead 32 is electrically connected to the external terminal BP (the wiring 15) of the substrate 2 through the bonding wire 36.

The outer lead 33 is integrally formed to the other end portion of the inner lead 32 so as to lead outside the encapsulation resin 38. Although not illustrated in the drawings, the outer lead 33 conforms to a structure for mounting the semiconductor device 1 to a mounting substrate, and is molded into the shape of a terminal-insertion or surface-mounting type of lead.

The die pad 31, the inner lead 32, and the outer lead 33 are formed by being molded and cut out from a lead frame, not illustrated in the drawings. A sheet material such as, for example, an iron-nickel (Fe—Ni) alloy or a copper (Cu) alloy is employed for the lead 30. Gold (Au) or nickel (Ni)

plating is performed on the surface of the lead 30 at join regions and bonding regions of the lead 30 to enhance bonding performance.

Moreover, an Au wire may, for example, be employed as the bonding wire 36.

The encapsulation resin 38 is molded by a resin molding method using an epoxy-based resin material.

Diode D Cathode Region-Substrate-Support 20 Connecting Structure

As is schematically illustrated in FIG. 1, the semiconductor device 1 further includes a connection section (connection structure) 10 to electrically connect the n-type semiconductor region 4, configuring the cathode region of the diode D serving as the protected element, to the substrate-support 20 of the substrate 2.

To explain in more detail with reference to FIG. 2, the connection section 50 of the present exemplary embodiment is configured including the wiring 12, the wiring 15, the bonding wire 36, the bonding material 35, the die pad 31, and a bonding wire 37. Namely, the connection section 50 includes a signal path through which a signal flows from the inner lead 32 to the n-type semiconductor region 4 via the bonding wire 36, the external terminal BP, the wiring 15, and the wiring 12, and includes a short circuit path allowing the inner lead 32 to short circuit to the substrate-support 20 through the bonding wire 37, the die pad 31, and the bonding material 35. The bonding wire 37 electrically connects between the inner lead 32 and the die pad 31, and is formed by a similar material to the bonding wire 36.

Due to provision of the connection section 50 configured in this manner, when a positive surge voltage from the outer lead 33 is applied (input) to the cathode region of the diode D through the external terminal BP, a similar positive surge voltage is also applied to the substrate-support 20 through the die pad 31.

Operation and Advantageous Effects of Present Exemplary Embodiment

As illustrated in FIG. 1, the semiconductor device 1 according to the present exemplary embodiment includes the protected element configured by including the diode D on the substrate 2. The substrate 2 includes the conductive substrate-support 20, the insulation layer 21 on the substrate-support 20, and the active layer 22 on the insulation layer 21. The diode D is arranged in the active layer 22 and is configured including the anode region and the cathode region. More specifically, the anode region is configured by the p-type active layer 22, and the cathode region is configured by the n-type semiconductor region 4 formed on the main face of the active layer 22.

The semiconductor device 1 further includes the connection section 50. The connection section 50 electrically connects the cathode region of the diode D to the substrate-support 20 of the substrate 2.

Supposing a positive surge voltage were to be applied to the cathode region of the diode D, then this surge voltage would also be applied to the substrate-support 20. The substrate 2 is constructed with a field plate structure including the substrate-support 20, the insulation layer 21, and the active layer 22. When a surge voltage is applied to the substrate-support 20, an electric field effect is generated in the active layer 22 due to the field plate effect, such that a depletion layer formed at the p-n junction between the anode region and the cathode region spreads, alleviating an electric field occurring at the p-n junction. This accordingly enables the junction withstand voltage of the diode D to be increased without setting a lower impurity concentration in the active layer 22.

Since there is no need to set a lower impurity concentration in the active layer 22, the withstand voltage of the transistor Tr with respect to a surge voltage in the protected element can be increased without the affecting the characteristics of the transistor Tr by for example altering the threshold voltage or altering the parasitic capacitance thereof.

In other words, employing the substrate 2 having a SOI structure and adopting a simple configuration to electrically short circuit between the cathode region of the diode D and the substrate-support 20 enables a field plate structure to be easily constructed. Namely, the withstand voltage of the diode D can actually be increased without adding a fabrication process to the semiconductor device 1 to construct a field plate structure on the surface of the active layer 22.

Moreover, as illustrated in FIG. 2, the connection section 50 in the semiconductor device 1 according to the present exemplary embodiment is configured to electrically connect the cathode region (n-type semiconductor region 4) to a region of the substrate-support 20 opposing the diode D.

In other words, at least the substrate-support 20 should be short circuited to the cathode region, particularly at a region opposing the p-n junction between the anode region and the cathode region of the diode D. In particular, a sheet resistance value of the substrate-support 20 is high in cases in which there is a low impurity concentration set for the substrate-support 20, and so any surge voltage is preferably applied to the substrate-support 20 at a region near to the diode D.

In the semiconductor device 1 configured in this manner, when for example a positive surge voltage is applied to the cathode region of the diode D, the surge voltage is immediately applied to the region of the substrate-support 20 opposing the diode D. An electric field occurring at the p-n junction of the diode D is accordingly immediately alleviated, enabling the junction withstand voltage of the diode D to be increased.

Furthermore, as illustrated in FIG. 1, in the semiconductor device 1 according to the present exemplary embodiment, the transistor Tr is arranged in a different region to that of the diode D in the active layer 22 of the substrate 2. Since the junction withstand voltage of the diode D can be increased without setting a lower impurity concentration in the active layer 22, the characteristics of the transistor Tr are not altered.

Note that alterations to the characteristics of a semiconductor element can be suppressed even in cases in which, instead of the transistor Tr, there is one or more element out of a bipolar transistor, a diffusion resistor, or a metal insulator semiconductor (MIS) capacitor arranged as the semiconductor element.

For example, in the case of a bipolar transistor, there is no need to set a lower impurity concentration for the active layer 22, and so there is no alteration to the parasitic capacitance applied to an operation region. Moreover, for example, in the case of a diffusion resistor formed by an n-type semiconductor region, a depletion layer occurring at the p-n junction between the diffusion resistor and the active layer 22 can be suppressed from spreading, and so there is no alteration to the parasitic capacitance applied to the diffusion resistor. Furthermore, in the case of an MIS capacitor, a depletion layer can be suppressed from spreading, and so there is also no alteration to the parasitic capacitance applied to the capacitor.

Moreover, as illustrated in FIG. 2, the semiconductor device 1 according to the present exemplary embodiment further includes the external terminal BP (wiring 15), the die pad 31, and the lead 30. The external terminal BP is arranged on the substrate 2, and is electrically connected to the cathode region (n-type semiconductor region 4) of the diode D. The die pad 31 has the substrate 2 mounted thereto, and is electrically connected to the substrate-support 20 of the substrate 2. The lead 30 is electrically connected to the external terminal BP through the bonding wire 36. Note that the connection section 50 in this example is a configuration to electrically connect the lead 30 and the die pad 31.

Thus, supposing a positive surge voltage were to be applied from the lead 30 to the cathode region via the bonding wire 36 and the external terminal BP (through the signal path), a positive surge voltage could also easily be applied from the lead 30 to the substrate-support 20 via the die pad 31 (through the short circuit path). This enables an increase in the junction withstand voltage of the diode D to be easily implemented due to the field plate effect.

Note that although as illustrated in FIG. 2 the substrate 2 is bonded onto the die pad 31 of the lead 30 in the semiconductor device 1 according to the present exemplary embodiment, a wiring board may be employed instead of the die pad 31, and the substrate 2 may be bonded onto the wiring board. Of course, wiring electrically connected to the substrate-support 20 would be arranged in at least a region of the wiring board opposing the diode D.

Second Exemplary Embodiment

Figure 3:
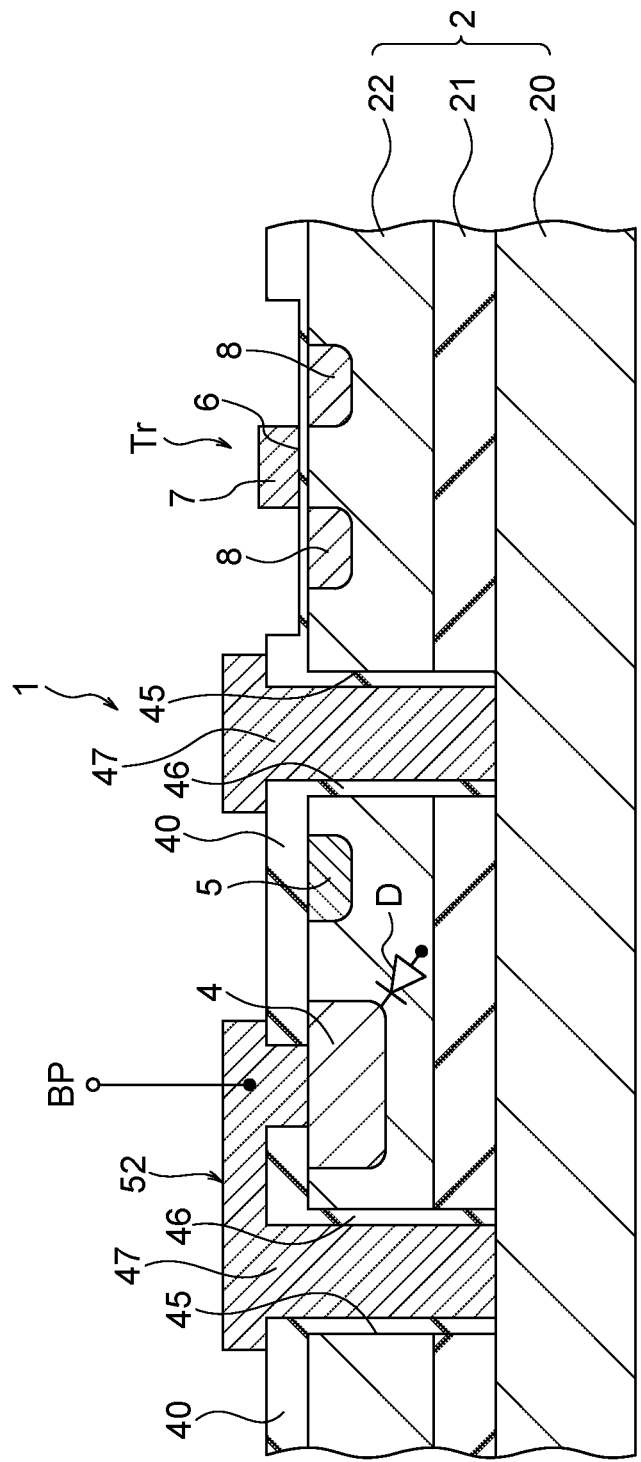
FIG. 3 is a vertical cross-section structural diagram corresponding to FIG. 1 and schematically illustrating an enlargement of relevant portions of a semiconductor device according to a second exemplary embodiment of the present invention.

Explanation follows regarding a semiconductor device according to a second exemplary embodiment of the present invention, with reference to FIG. 3. Note that in the present exemplary embodiment, configuration elements that are the same or basically the same as those in the semiconductor device 1 according to the first exemplary embodiment are appended with the same reference numerals, and duplicate explanation thereof is omitted.

Instead of the connection section 50 of the semiconductor device 1 according to the first exemplary embodiment, the semiconductor device 1 according to the present exemplary embodiment illustrated in FIG. 3 includes a connection section 52. The connection section 52 is arranged in close proximity to the diode D so as to surround part or the entire periphery of the diode D. The connection section 52 is configured including a trench 45, an insulation body 46, and a conductor 47.

The trench 45 is formed as a cavity or a groove penetrating from a main face of the active layer 22 of the substrate 2 as far as the surface of the substrate-support 20 in the thickness direction of the active layer 22 and the insulation layer 21. The trench 45 can be easily formed by anisotropic etching such as reactive-ion etching (RIE) during a fabrication process of the semiconductor device 1.

The insulation body 46 is formed to side walls of the trench 45, and is for example formed by a silicon oxide film. The silicon oxide film may for example be formed using a chemical vapor deposition (CVD) method.

The conductor 47 fills the trench 45 with the insulation body 46 interposed between the conductor 47 and the trench 45. For example, a polycrystalline silicon film doped with impurities so as to be adjusted to a low resistance value may be employed as the conductor 47. In the fabrication process, such a polycrystalline silicon film may for example be filled into the trench 45 by deposition using a CVD method until the polycrystalline silicon film spreads out over the active layer 22. The surface of the polycrystalline silicon film is then flattened so as to leave a certain thickness for wiring lines over the active layer 22 while leaving the trench 45 completely filled. An etching method or a chemical mechanical polishing (CMP) method may be employed for flattening.

Part of the conductor 47 is connected to an n-type semiconductor region serving as the cathode region of the diode D through a connection hole (not allocated a reference numeral) formed in a passivation film 40 formed on the main face of the active layer 22.

Note that an element isolation region, called trench isolation, is constructed in cases in which the connection section 52 is arranged so as to surround the entire periphery of the diode D.

Operation and Advantageous Effects of Present Exemplary Embodiment

As illustrated in FIG. 3, in the semiconductor device 1 according to the present exemplary embodiment, the connection section 52 includes the trench 45, the insulation body 46, and the conductor 47. The trench 45 is configured extending from the surface of the active layer 22 as far as the substrate-support 20. The insulation body 46 is arranged on the side walls of the trench 45. The conductor 47 fills the trench 45 with the insulation body 46 interposed between the conductor 47 and the trench 45. Note that the cathode region of the diode D is electrically connected to the substrate-support 20 through the conductor 47.

Thus, supposing a positive surge voltage were to be applied to the cathode region, then a surge voltage could easily be applied to the substrate-support 20 through the conductor 47 that fills the trench 45. This accordingly enables an increase in the junction withstand voltage of the diode D to be easily implemented due to the field plate effect, without altering the characteristics of the transistor Tr.

Note that the conductor 47 that fills the trench 45 of the connection section 52 may be electrically connected to the cathode region (n-type semiconductor region 4) of the diode D through the first layer wiring 12 described in the semiconductor device 1 according to the first exemplary embodiment and illustrated in FIG. 2.

Supplementary Explanation of Above Exemplary Embodiments

The present invention is not limited to the above exemplary embodiments, and for example modifications such as those described below may be implemented within a range not departing from the spirit of the present invention.

In the substrate of the semiconductor device of the present invention, the substrate-support is not limited to being a monocrystalline silicon substrate, and as long as the substrate is conductive, a metal substrate, a compound semiconductor substrate, or the like may be employed therefor.

Moreover, in the present invention any element including a p-n junction diode may be employed as the protected element, such as an IGFET, a bipolar transistor, or a diffusion resistor. Specifically, a diode is formed at the p-n junction between one main electrode of an IGFET and the active layer. In cases in which a bipolar transistor is employed, a diode is formed at the p-n junction between a base region (active layer) and an emitter region or a collector region. In cases in which a diffusion resistor is employed, a diode is formed at the p-n junction between the diffusion resistor and the active layer.

Furthermore, in the present invention, a protected element may be constructed by two or more elements, such as a combination of a diode and an IGFET, or a combination of a diffusion resistor and an IGFET.

The entire content of the disclosure of Japanese Patent Application No. 2018-135260 filed on Jul. 18, 2018 is incorporated by reference in the present specification.

The invention claimed is:

1. A semiconductor device comprising:
a protected element that is configured to include a p-n junction diode between an anode region and a cathode region, and arranged on an active layer of a substrate including the active layer formed over a conductive substrate-support with an insulation layer interposed between the active layer and the substrate-support;
a connection section that electrically connects the cathode region to the substrate-support; and
a semiconductor element that is arranged in the active layer in a separate region to the protected element, the semiconductor element being any one out of an insulated-gate field-effect transistor, a bipolar transistor, a diffusion resistor, or a metal-insulator-semiconductor capacitor.

2. The semiconductor device of claim 1, wherein the connection section is electrically connected to both at least a portion of a region of the substrate-support opposing the p-n junction diode and to the cathode region, or is electrically connected to both a portion of the substrate-support in close proximity to the p-n junction diode and to the cathode region.

3. The semiconductor device of claim 1, further comprising:
an external terminal that is arranged on the substrate and electrically connected to the cathode region;
a die pad or wiring board that is mounted with the substrate and electrically connected to the substrate-support; and
a lead electrically that is connected to the external terminal through a wire; wherein
the connection section is configured to include a path electrically connecting the lead either to the die pad or to the wiring board.

4. The semiconductor device of claim 1, wherein:
the connection section includes a trench extending from a surface of the active layer as far as the substrate-support;
an insulation body arranged on side walls of the trench; and
a conductor filling the trench with the insulation body interposed between the conductor and the trench; wherein
the cathode region and the substrate-support are electrically connected through the conductor.

5. A semiconductor device comprising:
a protected element that is configured to include a p-n junction diode between an anode region and a cathode region, and arranged on an active layer of a substrate including the active layer formed over a conductive substrate-support with an insulation layer interposed between the active layer and the substrate-support; and
a connection section that electrically connects the cathode region to the substrate-support,
wherein:
the connection section includes a trench extending from a surface of the active layer as far as the substrate-support;
an insulation body arranged on side walls of the trench; and
a conductor filling the trench with the insulation body interposed between the conductor and the trench; wherein
the cathode region and the substrate-support are electrically connected through the conductor.

6. The semiconductor device of claim 5, wherein the connection section is electrically connected to both at least a portion of a region of the substrate-support opposing the p-n junction diode and to the cathode region, or is electrically connected to both a portion of the substrate-support in close proximity to the p-n junction diode and to the cathode region.

7. The semiconductor device of claim 5, further comprising a semiconductor element that is arranged in the active layer in a separate region to the protected element, the semiconductor element being any one out of an insulated-gate field-effect transistor, a bipolar transistor, a diffusion resistor, or a metal-insulator-semiconductor capacitor.

* * * * *